United States Patent [19]

Gooden

[11] Patent Number: 4,691,739
[45] Date of Patent: Sep. 8, 1987

[54] BOOTSTRAP RESERVOIR

[75] Inventor: Richmond A. Gooden, Kettering, Ohio

[73] Assignee: United Aircraft Products, Inc., Dayton, Ohio

[21] Appl. No.: 902,687

[22] Filed: Sep. 2, 1986

[51] Int. Cl.⁴ ............................................. F16L 55/04
[52] U.S. Cl. .................... 138/31; 73/40.5 R; 417/540
[58] Field of Search ...................... 738/30, 31; 73/40.5; 417/540; 220/85 B; 92/94, 98 R, 98 D

[56] References Cited

U.S. PATENT DOCUMENTS

| | | | |
|---|---|---|---|
| 1,663,647 | 3/1928 | Brush | 138/31 X |
| 2,353,692 | 7/1944 | Cunningham | 138/31 X |
| 3,099,189 | 7/1963 | Blondiau | 138/30 X |
| 3,672,402 | 6/1972 | Bloemer | 138/31 X |
| 3,862,646 | 1/1975 | Tarsha | 138/31 X |

FOREIGN PATENT DOCUMENTS 588332  5/1947  United Kingdom ................ 138/30

Primary Examiner—James E. Bryant, III
Attorney, Agent, or Firm—J. E. Beringer

[57] ABSTRACT

An accumulator-reservoir device in a liquid cooling system utilizes a piston and metallic bellows to separate system pressures that are high and low in relation to one another. A piston position indicator is used sensing less than the full piston stroke in a manner to yield an accurate quantity measurement without undue elongation of parts.

12 Claims, 5 Drawing Figures

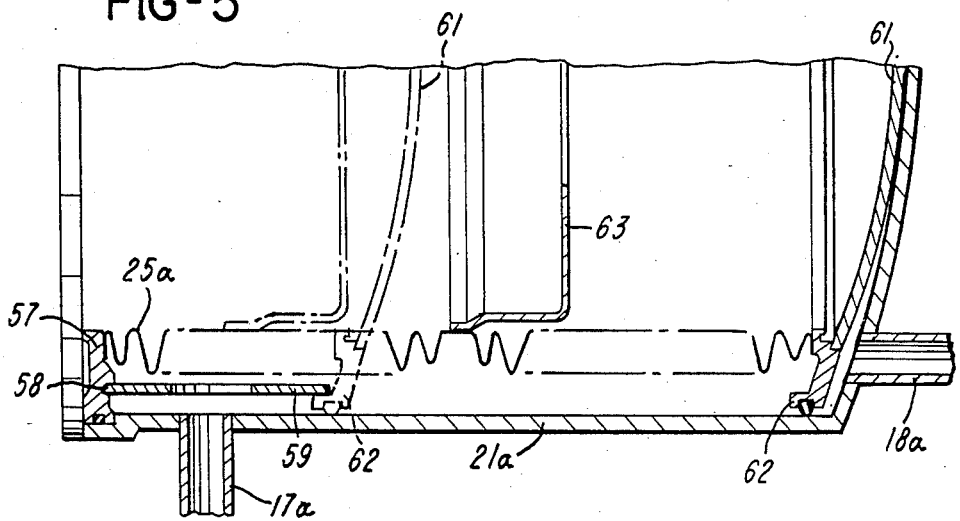

BOOTSTRAP RESERVOIR

BACKGROUND OF THE INVENTION

1. Field of the Invention

This invention relates to closed liquid coolant circulating and like systems. It is in general an improvement in a class of device as disclosed in the following prior patents, which patents contain the most pertinent prior art teachings of which I am aware:

Hill et al, U.S. Pat. No. 3,559,727, Feb. 2, 1981
Bathla, et al, U.S. Pat. No. 3,677,334, July 18, 1972
Lord, U.S. Pat. No. 4,067,381, Jan. 10 1978
Haushalter, et al., U.S. Pat. No. 4,376,619, Mar. 15, 1983
Gooden, U.S. Pat. No. 4,538,972, Sept. 3, 1985

2. Description of the Prior Art

As may be learned from a consideration of the above patents, particularly Haushalter, et al. and Gooden, accumulator-reservoirs of the bootstrap kind may have problems of sealing from high pressure to ambient. Also, and with particular reference to Hill et al, Bathla, et al. and Lord, accurate indications of the amount of liquid in the closed liquid circulating systems are complicated by the effect temperature has on liquid density. Sealing improvement and decreased complexity of temperature compensated quantity indication are subjects receiving continuing developmental attention.

SUMMARY OF THE INVENTION

The instant invention has in view improvement in both sealing and quantity indication with, according to a feature of the invention, interrelated effects in the two areas of development.

Haushalter, et al., shows a form of sealing as accomplished by a flexible rolling diaphragm made of an elastomeric material. Gooden shows a form of sealing in which an arrangement of sliding seals replaces the diaphragm. Both are practicable. The rolling diaphragm, however, functions both with accessory help and may suffer from inconsistent molding results. The sliding seal arrangement may be thought by a user to lack the completely positive sealing effect some installations may require. With these facts in mind an accumulator-reservoir according to the present invention substitutes for the rolling diaphragm of the prior art a metallic bellows. One end of the bellows is secured, as by welding, to the sliding piston. The other end is similarly secured to and based on a stationary part of the reservoir housing. The metallic bellows has the desired flexibility and at the same time has an inherent ability to recover from a collapsed condition, obviating any need for an accessory spring as taught in Haushalter, et al. It is, moreover, because of the welded joints, positively acting in the separation it enforces between high system pressure and ambient, eliminating the need for a sliding seal at this location.

With respect to temperature compensated quantity indication, this subject was originally dealt with in Hill, et al. There, an observer can look at a temperature scale traversed by the movable piston and make a visual determination, based on knowledge of existing liquid temperatures, of whether or not the system is properly charged or filled. This technique, while entirely workable and useful, requires that the accumulator-reservoir device be visually accessible. Also, the observer is required to know the liquid temperature at the time of reading. Bathla, et al. introduced the concept of remote indication, as in the illuminating of a light when the system is less than fully charged and extinguishing the light in a full condition. Bathla, et al., use a linear potentiometer to measure piston movement and a device responding electrically to changes in liquid temperature. An electronic analyzer compares piston position with liquid temperature to turn the remote signalling light on and off. In Bathla, et al., the moving portion of the potentiometer is fastened directly to the piston and must have a physical elongation to respond to piston travel over its full length. In the interest of compactness it is often undesirable that reservoir parts be so extended. Also, in the interest of precision it is desirable that liquid temperature be sensed at more than one system location, with the electronic analyzer taking into account the average of the sensed temperatures. Lord discloses a mechanical means for dealing with changing piston position and changing liquid temperature, for applications in which use of electronic equipment may be undesirable. The present invention has in view a piston position indicator like the linear potentiometer of Bathla, et al. However, it takes advantage of the construction and mode of operation of the metallic bellows by actuating the moving portion of the potentiometer from an intermediate location along the bellows length. Thus, a potentiometer actuator, stationed for example mid-way between the ends of the bellows, has only a fraction of the travel of the piston itself. The moving portion of the potentiometer has a range of movement proportional to but less than the range of piston motion. The proportionality of motion is taken into account in the electronic analyzer so that relatively small increments of potentiometer motion are read as corresponding to the relatively larger actual piston movements. A shorter length potentiometer makes possible a shorter overall length of accumulator-reservoir device. A plurality of temperature sensors are used, with the electrical resistance produced being introduced into the electronic analyzer for averaging and comparison with sensed piston position.

An object of the invention is to provide accumulator-reservoir apparatus characterized substantially as in the foregoing.

Other objects and structural details of the invention will appear from the following description when read in connection with the accompanying drawings, wherein:

FIG. 5 is a fragmentary view of still another invention embodiment.

Figure 1:
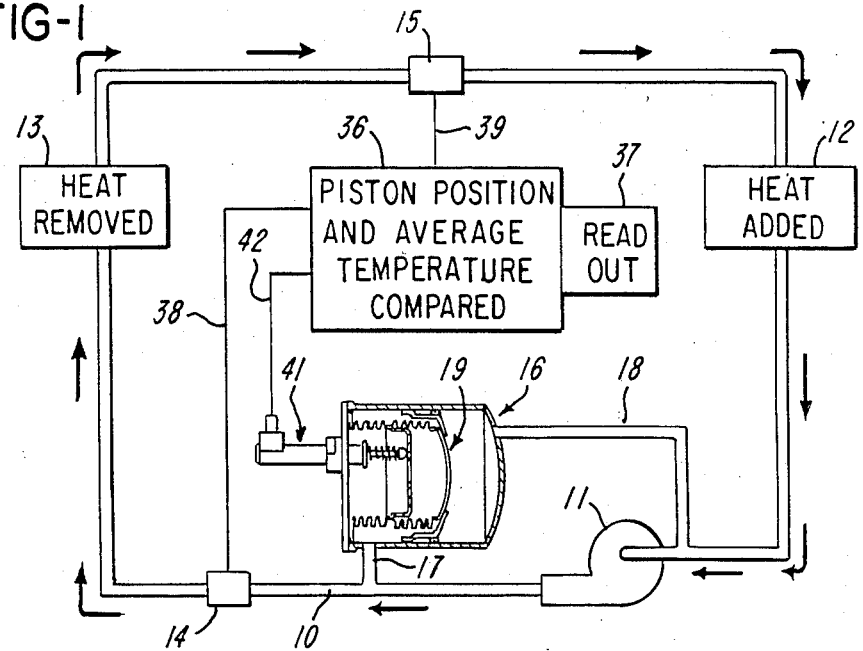
FIG. 1 is a diagram of a liquid coolant circulating system structured as in a first considered embodiment of the invention.

Referring to the drawings, a system as shown in FIG. 1 circulates liquid coolant in a closed loop to the end that heat generated in electronic apparatus, for example, may be removed. In the described loop, indicated as comprising a line 10, is a pump 11 continuously operated by suitable means for a continuous, pressured circulation of liquid. The source of the heat to be removed is a unit 12, also in the path of flow through the line 10.

Still further in the main flow path of circulated liquid is a heat exchanger 13. Heat added to or absorbed by the circulating coolant in unit 12 is removed in heat exchanger 13 where it is rejected to flowing air or another liquid acting as a heat sink. Still further in the line 10 are temperature sensors or thermistors 14 or 15 stationed respectively on upstream and downstream sides of the heat exchanger 13, having regard to the direction of coolant flow.

The system operates most efficiently when filled with liquid. To accommodate liquid expansion and contraction (occurring as a result of temperature change) the system includes an accumulator-reservoir device 16. The latter is connected across output and intake sides of the pump 11 by lines 17 and 18. Since the liquid in the circulating system, including that in reservoir 16, is sealed from ambient surroundings, a piston 19 is provided in the reservoir device, pressurized by the pump output to insure a continuing availability of liquid at the intake side of the pump. The reservoir device 16 is of the "bootstrap" variety in that relatively high pressure liquid introduced by way of line 17 is used to pressure piston 19. The latter, as will be understood, acts upon the relatively low pressure side of the system, or that portion adjacent to the pump intake.

Figure 2:
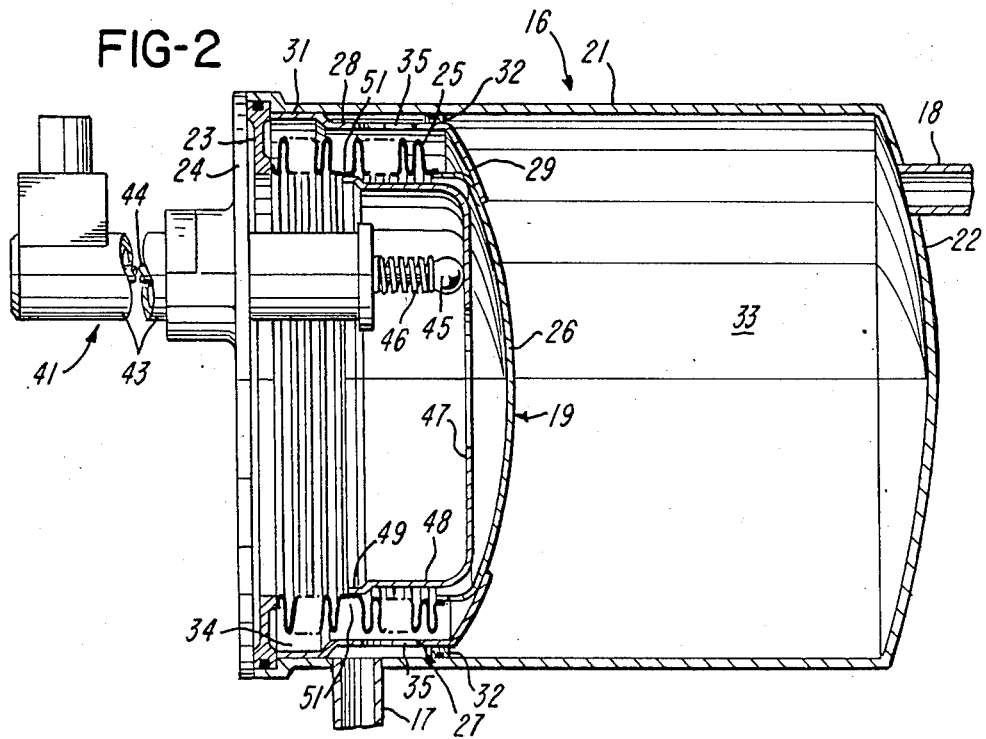
FIG. 2 is a partly diagrammatic view of the accumulator-reservoir device of FIG. 1, the device being relatively enlarged and shown in a position assumed in a "hot" condition of the system.
Figure 3:
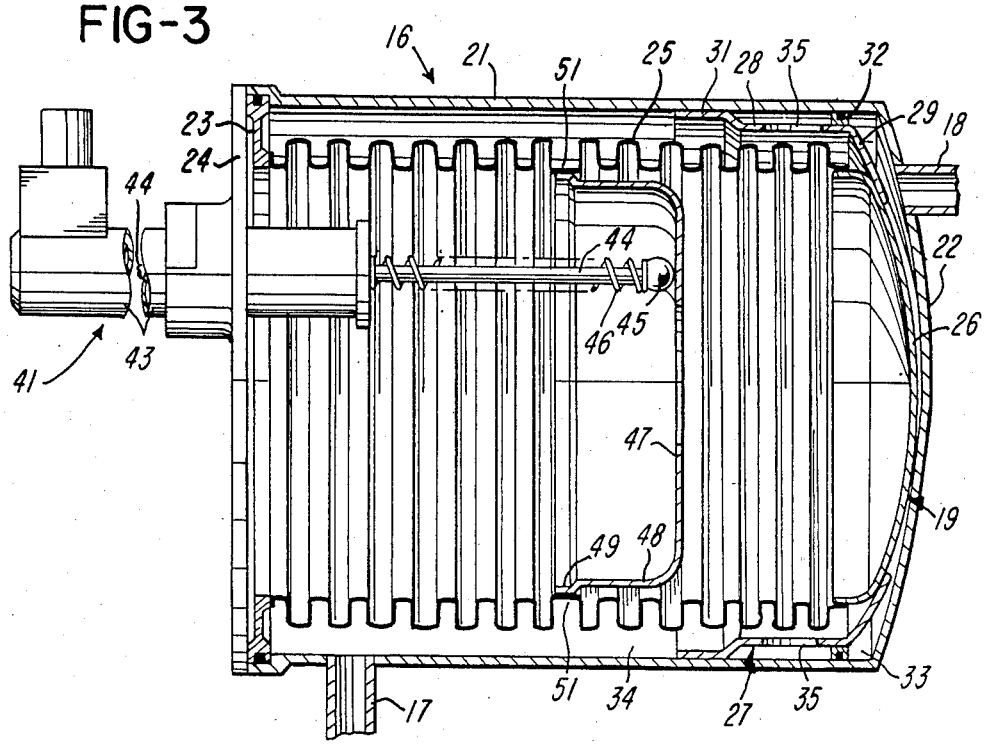
FIG. 3 is a view like FIG. 2 showing parts in positions assumed in a "cold" condition of the system.

As seen more particularly in FIGS. 2 and 3, the reservoir device 16 includes a generally cylindrical shell 21 closed at one end by an integral wall 22. The opposite end of shell 21 is open and formed with a counterbore in which is seated a ring shaped member 23 a portion of which projects radially inwardly to lie within the shell. A mounting plate 24 is bolted or otherwise removably attached to the shell 21 at its open end and holds the member 23 in place. Shell 21 may be regarded as being part of a shell assembly further comprising parts 23-24. Within the shell 21, and arranged coaxially thereof, is a metallic bellows 25. The outside diameter of the bellows is less than the inside diameter of shell 21. One end of the bellows engages and is welded to the member 23 at or adjacent to its inner periphery.

The piston 19 is comprised of an assembly of parts. These include a concavo-convex head 26 transversely positioned in the shell. Peripherally, the head 26 is welded to what may be regarded as the outer free end of the bellows 25. The member 23 is, in a completed assembly, a relatively fixed, stationary part whereas piston part 26 is free to move in an axial sense toward and away from part 23. The bellows 25 is a flexible, convoluted member and expands and collapses upon itself responsively to movements of piston part 26 respectively away from and toward stationary part 23. Extremes of motion are shown in FIGS. 2 and 3. The welds attaching the bellows ends to parts 23 and 26 positively interconnect the parts, and, in addition, act as positive seals. The bellows effectively seats to the part 23 which acts as a reactant member therefor. The bellows, the piston and reactant member 23 are an interconnected subassembly installed in the shell as a unit.

Further comprised in the piston assembly is a skirt or shroud 27 which includes an intermediate cylindrical portion 28 in surrounding spaced relation to the bellows 25. One end 29 of the skirt 27 is bent inward to overlap piston head portion 26 and is welded thereto. The other end 31 of the skirt is expanded to achieve a light bearing contact with the inner wall of shell 21. Expanded end 31 acts as a guide, and, by abutment to stationary member 23, limits movement of the piston assembly in a direction to compress the bellows. Completing the piston assembly is a piston ring 32 in an attached, surrounding relation to skirt portion 27 and in a sealed, sliding relation to the inner wall of shell 21.

The interior construction of device 16 provides a chamber 33 between piston 19 and end wall 22, and a chamber 34 between piston 19 and stationary ring member 23. Chamber 34 occupies the annular space surrounding bellows 25. Cylindrical skirt portion 28 has apertures 35 making the space between portion 28 and the shell body a part of annular chamber 34. As diagrammatically indicated, system line 18 opens into chamber 33 while system line 17 opens into annular chamber 34.

The chambers 33 and 34 are normally filled with the liquid coolant, the former with the relatively low pressure liquid flowing to the pump intake and the latter with the higher pressure liquid discharging from the pump outlet. The higher pressure fluid in chamber 34 reacts on member 23 to urge piston 19 outwardly or toward wall 22. Chamber 33 is a reservoir accommodating temperature induced liquid expansion and contraction. The piston 19 tends to assume a position in which opposing forces are balanced and exerts a continuing pressure on the liquid in chamber 33. The volume of liquid coolant within the closed system increases and decreases with increases and decreases in coolant temperature. The changing volume is accommodated by axial adjustments of the piston 19. Under maximum expected temperature conditions (FIG. 2) the piston 19 is fully contracted and bellows 25 fully compressed. Under minimum expected temperature conditions (FIG. 3) the piston and bellows are fully extended.

The liquid coolant system is required initially to be filled. Also, service inspections are made to determine that the system has remained full or that a faulty seal or the like has not allowed the system to be critically depleted. Due to the variant introduced by temperature, any form of quantity indicator is required to be temperature compensated. In the present instance, the quantity level can be determined by sensing the location of movable piston 19 relative to fixed boundaries of the reservoir shell and relating actual piston position to the piston position known to be correct for existing coolant temperature conditions. This is done in an electronic analyzer 36 with the results being shown by an indicator 37. Devices 36 and 37 are shown only diagrammatically here since details of their construction and mode of operation do not form a part of the present invention. Electronic signals from temperature sensors 14 and 15 are directed to device 36 by electrical leads 38 and 39. A potentiometer 41 senses piston position and signals device 36 through a lead 42. The sensed temperatures are averaged and the average temperature, having a "correct" piston position identification, is compared with the actual piston position. The results, in terms of fractional fill indications are displayed at 37.

The potentiometer 41 is comprised of an elongated cylindrical housing 43 installed in end plate 24 to have an inner end projecting within shell 21, interiorly of bellows 25 and to have an outer end project longitudinally to the shell exterior. The housing 43 is fixed against endwise movement relative to the shell. Reciprocable within the housing 43 is a rod 44, one end of which projects from the inner end of the housing and carries an anti-friction ball 45. A lightweight compression spring 46 is interposed between the housing inner end and ball 45 and urges the rod 44 toward piston 19 or rightward as viewed in the drawings. The ball 45 contacts a wall 47 of an actuator ring further including a peripherally inturned cylindrical portion 48. The latter is in a generally parallel, adjacent relation to the bellows 25. An expanded extremity 49 of portion 48 contacts and is welded to a valley portion of a selected bellows convolution. Thus, at a selected point along its length, in the present instance a mid-way location, a bellows convolution is flattened in its valley portion to produce a land 51. Extremity 49 is welded to land 51.

The actuator ring 47-49 partakes of the axial movements of piston 19 but has a more limited range of motion. Its extent of motion is proportional to that of the piston, in the present instance a given extent of piston movement producing half as much movement of the actuator ring.

Potentiometer rod 44 accordingly is in a following relation to piston 19 and moves with it but over shorter distances. The rod 44 moves relative to an electrical coil (not shown) which is a part of housing 43, and, in a manner which it is unnecessary here to describe and illustrate, is responsible for the sending of an electrical signal through lead 42 to analyzer 36. In this regard, the potentiometer 41 is or may be like the corresponding device shown in the Bathla, et al., patent. However, whereas in the Bathla, et al., patent the potentiometer rod has a travel which is the same as the travel of the piston, in the present instance the movement of the potentimeter rod is only one-half the piston travel. The overall length of the accumulator-reservoir device is accordingly substantially less than would otherwise be required. The lesser but proportional motion of the potentimeter rod is accepted and interpreted in its true terms in analyzer 36.

Figure 4:
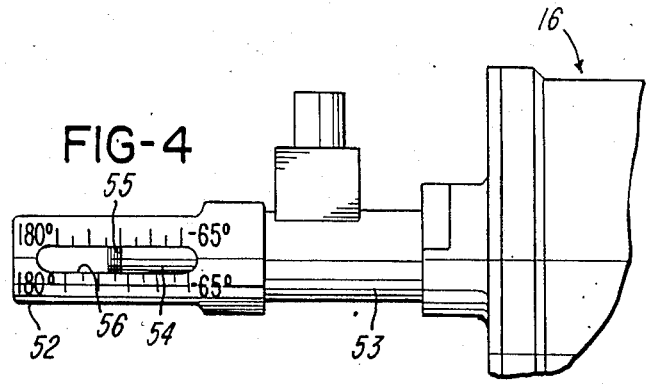
FIG. 4 is a fragmentary view of an accumulator-reservoir device in another invention embodiment.

The system of FIGS. 1-3 is disclosed as adapted for relatively remote quantity indications. Frequently the location of an accumulator-reservoir device is such that it is not readily accessible to visual inspection. In those instances when it is so accessible, however, direct quantity indications can be read in the manner taught in Hill, et al. Thus, as shown in FIG. 4, a sleeve 52 is screwed onto a potentiometer housing 53 corresponding to and installed as is housing 43. A potentiometer rod 54 projects through and beyond the outer end of housing 53 and is reciprocable in sleeve 52. A mark 55 on the rod is visible through a longitudinally elongated window 56 in the sleeve 52. Offset temperature scales are on opposite sides of the window 56. As taught by Hill, et al., with knowledge of existing coolant temperature, observation of the position of mark 55 relative to the offset temperature scales produces a reading or indication of the extent to which the coolant system may be filled, over filled or under filled. The structure of FIG. 4 may be used in lieu of or in addition to the remote signalling system of FIG. 1. Both parts 44 and 54 may be identified as projectible indicator rods, serving in the one instance to initiate appropriate electronic activity and in the other instance to provide direct visual readings.

In the invention embodiments of FIGS. 1-4, overcompression of the metallic bellows is avoided by providing the skirt or shroud 27 which limits against member 23. An alternate concept is seen in FIG. 5 where a ring member 57, corresponding to member 23 of FIG. 1, has a circular slot 58 in its inner face at a location to surround the point of attachment of the metallic bellows 25a. Set in the slot 58, and suitably fixed in position, is a cylinder 59 which projects perpendicularly away from member 57 in surrounding spaced relation to bellows 25a. The piston assembly is, in this instance, comprised of a dome 61 and a ring shaped piston portion 62 sliding in the shell 21a. The piston portion 62 has a flattened area for attachment of the bellows thereto, and, outwardly of such area, is adapted to limit against the outer projecting end of the cylinder 59. The cylinder 59 is apertured for a free movement of liquid within the relatively high pressure annular chamber surrounding the bellows and between member 57 and piston portion 62. In the embodiment of FIG. 5, an actuator ring 63 is mounted to an intermediate bellows convolution substantially in the same manner and to the same ends as the ring 47-49 of FIGS. 1-3 is mounted and used.

Embodiments of the invention are shown for illustrative purposes, without limiting intentions.

What is claimed is:

1. A bootstrap accumulator-reservoir device for use in a closed system circulating liquid under pump pressure and having high pressure and low pressure system portions related respectively to pump output and intake sides, including a shell assembly providing a reservoir accommodating liquid expansion and contraction, means for communicating said reservoir with a low pressure system portion, a piston assembly in said shell assembly for applying pressure to liquid in said reservoir, a metallic bellows stretched between said piston assembly and a stationary part of said shell assembly defining an annular pressure applying chamber surrounding said bellows and on a side of said piston assembly oppositely of said reservoir, and means for communicating said annular pressure chamber with a high pressure system portion, one end of said metallic bellows being joined to said stationary part of the shell assembly in a manner to anchor said other bellows end and to preclude communication of said high pressure annular chamber with ambient surroundings.

2. A device as in claim 1, said shell assembly including a ring-shaped reactant member to which said other end of said bellows is fixed, a portion of said reactant member radially outwardly of a point of attachment of said bellows thereto providing a reactant surface for liquid pressure applied in said annular chamber to pressure said piston assembly.

3. A device as in claim 2, said ring-shaped reactant member being applied in an end of said shell assembly opposite a closed end thereof which closed end cooperates with said piston assembly in defining said reservoir, the interior of said bellows opening through the center of said reactant member.

4. A device as in claim 3, a mounting plate being applied to the first said end of said shell assembly in a closing relation to said reactant member, a projectible indicator rod supported by said mounting plate and having an end extending interiorly of said bellows, and means acting on said interiorly extending end of said indicator rod effecting axial movements of said rod proportional to longitudinal movements of said piston assembly.

5. A device as in claim 4, said means acting on said rod including an actuator fixed to a convolution of said bellows intermediate the ends thereof.

6. A device as in claim 5, a valley portion of one of the convolutions of said bellows being flattened for attachment of said actuator thereto.

7. A device as in claim 4, an indicator rod housing projecting to the exterior of the shell assembly, and means mounted to said housing providing a temperature scale traversed by an end of said rod opposite the end acted on interiorly of said bellows.

8. A bootstrap accumulator-reservoir device for use in a closed liquid circulating system, including a shell assembly, a piston assembly reciprocable in said shell assembly, a metallic bellows stretched between said piston assembly and a stationary part of the shell assembly defining an annular pressure chamber, said bellows extending and contacting responsively to extending and retracting movements of said piston assembly, means for communicating said pressure chamber with a high pressure location in the liquid circulating system, and means for indicating exteriorly of said shell assembly the position of the piston assembly in said shell assembly, said means including an actuator utilizing extending and contracting movements of an intermediate convolution of said bellows having a range of motion proportional to but less than that of said piston assembly.

9. A device as in claim 8, said indicating means further including an indicator rod mounted for longitudinal sliding motion in an end portion of said shell assembly, one end of said rod projecting exteriorly of said shell assembly and the other end terminating interiorly of said bellows in a following relation to said actuator.

10. A bootstrap accumulator-reservoir device, including a shell closed at one end and open at its opposite end to ambient surroundings, means providing toward said opposite shell end an annular reactant surface facing the said closed shell end, a piston slidably mounted in said shell between said surface providing means and said closed shell and creating with said closed shell end a fluid reservoir, a bellows dimensionally smaller in a transverse sense than said piston attached at its one end to said piston and attached at its opposite end to said surface providing means by means forming a sealed connection therewith, said bellows creating an annular pressure chamber between said piston and said surface providing means and precluding an escape to ambient of pressure fluid from said annular pressure chamber, and means for admitting pressure fluid to said annular pressure chamber.

11. A device as in claim 10, said piston, said bellows and said surface providing means being an interconnected assembly introduced as a unit into said shell through the open end thereof, and means for retaining said unitary assembly in said shell.

12. A device as in claim 10, wherein said piston has a sliding seal relationship to a surrounding housing wall, characterized in that said sliding seal which occurs between said annular pressure chamber and said reservoir is the only sliding seal in the device.

* * * * *